United States Patent
Kishida

(10) Patent No.: US 7,173,440 B2
(45) Date of Patent: Feb. 6, 2007

(54) PROBING APPARATUS AND TEST METHOD INCLUDING ELECTRICAL SHIELDING

(75) Inventor: Akito Kishida, Tokyo (JP)

(73) Assignee: Agilent Technologies, Inc., Palo Alto, CA (US)

(*) Notice: Subject to any disclaimer, the term of this patent is extended or adjusted under 35 U.S.C. 154(b) by 4 days.

(21) Appl. No.: 10/983,512

(22) Filed: Nov. 8, 2004

(65) Prior Publication Data

US 2005/0110508 A1 May 26, 2005

(30) Foreign Application Priority Data

Nov. 21, 2003 (JP) ............................. 2003-392775

(51) Int. Cl.
*G01R 31/02* (2006.01)
(52) U.S. Cl. .................................. 324/754; 324/158.1
(58) Field of Classification Search ................ 324/149, 324/754–765, 158.1, 73.1; 269/287, 903; 279/106, 156–15
See application file for complete search history.

(56) References Cited

U.S. PATENT DOCUMENTS 2,884,597 A * 4/1959 Miller ........................ 324/149
6,002,263 A * 12/1999 Peters et al. ................ 324/754
6,636,059 B2 * 10/2003 Harwood et al. ........... 324/754

FOREIGN PATENT DOCUMENTS

| JP | 06-053297 | 2/1994 |
| JP | 07-084003 | 3/1995 |
| JP | 2001-296547 | 10/2001 |

OTHER PUBLICATIONS

Cascade Microtech, Inc., "The Industry Standard in On-Wafer Device Characterization Summit Wafer Probing Systems", 2004.

* cited by examiner

Primary Examiner—Vinh P. Nguyen

(57) ABSTRACT

There is provided a prober that includes a chuck, a support base that supports the chuck, a first inner shield that shields the chuck, and an outer shield that encloses the chuck and the first inner shield. The outer shield is connected to a chassis, the chuck is connected to a first connector by a first cable, and the first inner shield is connected to a second connector by a second cable with an impedance device in between.

22 Claims, 2 Drawing Sheets

PROBING APPARATUS AND TEST METHOD INCLUDING ELECTRICAL SHIELDING

BACKGROUND OF THE INVENTION

1. Field of the Invention

The present invention relates to a prober used for testing liquid crystal display (LCD) panels, organic EL panels, and other display panels, and a testing apparatus thereof.

2. Discussion of the Background Art

The wafer probers cited in JP (Kokai) 6-53297 and JP (Kokai) 7-84003 are known for improving measurement accuracy and speed of wafer probers that are used to test semiconductor wafers. It is necessary to apply a voltage or a potential to the semiconductor substrate and by means of these wafer probers, voltage can be applied to the chuck. This potential is not limited to ground potential, and FIG. 2 of JP (Kokai) 7-84003 cites technology whereby an active guard is used as a countermeasure to noise in order to shield at guard potential. Moreover, technology whereby a region that includes the chuck and the device under test is enclosed by a conductor as an EMI shield is shown in FIG. 3 of JP (Kokai) 6-53297.

However, silicon is grown on the glass insulator of the display panel and the display panel theoretically takes on an SOI (Silicon-on-Insulator) structure. Therefore, it is not necessary to apply potential to the glass insulator with probers for display panels that are used for testing liquid crystal display (LCD) panels, organic EL panels, and other display panels, and a chuck potential that is essentially ground potential is sufficient. Therefore, the effect of noise on measurements can be all but disregarded and the chuck and the guard structure thereof have not been given special attention, as can be seen in FIG. 8 of JP (Kokai) 2001-296547.

Nevertheless, large glass sheets have been used in most display panels in recent years in order to reduce cost and it is therefore necessary to consider the effect of these glass sheets. For instance, fifth-generation amorphous silicon processes use glass sheets that are one square meter in size or larger. Therefore, the range of motion or a region of movement of the chuck stage must be as large as three square meters. Completely enclosing and shielding a region this size has a tremendous effect on cost.

Furthermore, it is also necessary to take into consideration the effect of a larger chuck that accompanies a larger glass sheet. Floating capacity (ground capacity) C to surface area S of the chuck is represented by $C=\epsilon r^*(S/d)$, with $\epsilon r$ serving as the material dielectric constant, when there is distance d between the chuck and ground and there is an insulator in between the chuck and ground. However, because seventh-generation panels used glass sheets that are approximately two square meters in size, they are more than twice as large as the length on one side of fifth-generation panels and floating capacity is four-times larger than that of the fifth-generation panels. Therefore, the AC impedance of the seventh-generation panels is much smaller in the high frequency than that of the fifth-generation panels. It means that it is easy to introduce noise effects for the chuck in the measurement of the seventh-generation panels. Moreover, even if the chuck has been shielded with sufficient cost by the conventional way, the measurement apparatus for testing tends to be affected by noise from various paths.

Consequently, probers and testing apparatuses for display panel testing require noise countermeasures that are different from those used for semiconductor wafers.

An object of the present invention is to provide a prober for testing display panels with which the effect of noise is reduced and a testing apparatus thereof.

Another object of the present invention is to provide a prober for testing display panels with which high-speed, high-accuracy testing is possible, and a testing apparatus thereof.

Yet another object of the present invention is to provide a prober for testing display panels and a testing method thereof with which the chuck stage is kept at high impedance in terms of alternating current (AC) signals and an electrostatic shield is effectively implemented.

Still another object of the present invention is to provide a prober for testing display panels and a testing apparatus thereof with which the effect of noise attributed to the motor drive system of the prober is reduced.

The purpose of the present invention is therefore to provide a prober for testing display panels and a testing apparatus capable of achieving these objects. This purpose is accomplished by the combination of characteristics cited in the independent claims. Moreover, the subordinate claims specify the further preferred embodiments of the present invention.

SUMMARY OF THE INVENTION

The prober for testing display panels of the present invention is a prober for testing display panels comprising a chuck, a support base that supports the chuck, a first inner shield that shields the chuck, and an outer shield that encloses the chuck and the first inner shield, wherein the outer shield is connected to a chassis, the chuck is connected to a first connector by a first cable, and the first inner shield is connected to a second connector by a second cable with an impedance device in between.

Moreover, the prober of the present invention includes the embodiment wherein the prober comprises a third connector that is connected by a third cable wherein the second cable is connected to the first inner shield, and the embodiment wherein any of the first through third cables is a coaxial cable and the outer conductor thereof is connected to the chassis. The prober of the present invention includes the embodiment wherein the prober comprises a second inner shield wherein the top of the chuck is shielded inside the shield, and the first inner shield shields the bottom and sides of the chuck. It further includes the embodiment wherein the impedance device includes an inductor and an embodiment wherein the impedance device includes a resistor.

Another prober for testing display panels is a prober for testing display panels comprising a chuck, a support base that supports the chuck, a first inner shield that shields the chuck, and an outer shield that encloses the chuck and the first inner shield, wherein the outer shield is connected to a chassis, the chuck is connected to a first connector by a first cable, and the first inner shield is connected to the chassis by a second cable with an impedance device in between.

An apparatus for testing display panels of the present invention comprises a prober with the above-mentioned structure, a first voltage source that supplies a first predetermined voltage to the first connector, and a second voltage source connected to the second and third connectors that supplies a second predetermined voltage. Still another testing apparatus of the present invention includes the embodiment wherein the apparatus comprises a fourth cable that supplies the first predetermined voltage supplied to the first connector from the first power source to the second inner shield via the probe card.

DETAILED DESCRIPTION OF THE PREFERRED EMBODIMENT

Figure 1:
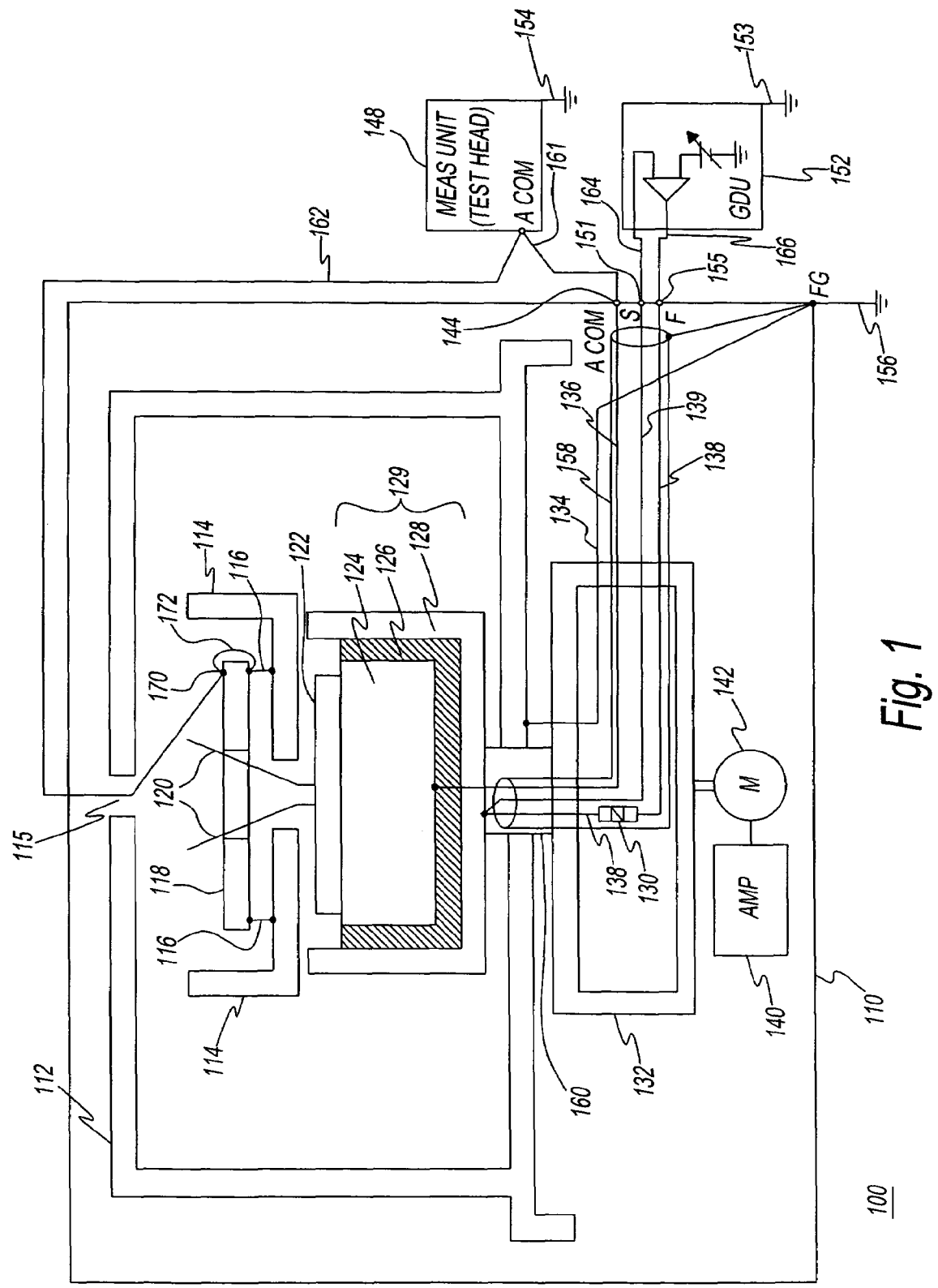
FIG. 1 is a schematic drawing showing the structure of the testing apparatus that is the preferred embodiment of the present invention.

One preferred embodiment of the present invention will now be described using FIG. 1. A prober 110 for testing display panels and a testing apparatus 100 thereof will be described. A device under test (display panel) 122 is mounted on a chuck 124 and measured by a probe needle 120 in a probe card 118. Probe needle 120 is connected to a measuring device that is not illustrated. By means of this embodiment, probe needle 120 is probing the device under test from an opening in the center of probe card 118. Chuck 124 is shielded by a first inner shield 128 with an insulator 126 sandwiched in between. It is preferred that first inner shield 128 covers the base and the sides of chuck 124 so that it extends at the sides higher than the height of the top surface of the device under test such that the chuck and the device under test are effectively guarded from outside noise.

Chuck 124, insulator 126, and inner shield 128 are included in a chuck stage 129. Chuck stage 129 is made into one unit with a support base or a body of a support base 132 by means of a support member 160, and support base 132 is moved in directions X, Y, and Z by a servo motor 142 controlled by a servo amplifier 140. Chuck stage 129, device under test 122, and probe card 118 are surrounded or enclosed by an outer shield 112. Although only shown roughly in the figure, support member 160 has a structure from the prior art such that it can move flexibly with no excess opening remaining at the bottom flat surface of outer shield 112.

Outer shield 112 has opening 115 in the top and is used to confirm that the tip of probe needle 120 is making contact, and for similar purposes. Although not specifically illustrated, probe card 118 and device under test 122 can be introduced and removed by making part of outer shield 112 so that it can open and close, by using a tray that slides back and forth horizontally, and the like. A second inner shield 114 in the shape of a ring is disposed at the bottom of opening 115 so that the potential at the surface of probe card 118 will not affect chuck 124 and device under test 122. The cross section of second inner shield 114 is L-shaped so that it can effectively block noise, not only vertically, but also horizontally and obliquely. Second inner shield 114 also serves to protect probe card 118. It is preferred that the horizontal part of second inner shield 114 have a shape such that it virtually covers the bottom of probe card 118, excluding the center through which probe needle 120 passes.

Chuck 124 is connected to an A COM terminal 144 of the prober by a cable 136 and to the A COM terminal of a measuring unit (MEAS UNIT) 148 by a cable 161. This measuring unit 148 and the A COM terminal thereof can be a test head that is part of a measuring unit and the A COM terminal disposed at this test head. Moreover, the A COM terminal of measuring unit 148 preferably provides the common potential or the ground potential of the measuring unit and the A COM terminal has a stable potential capability which can supply clean direct-current (DC) voltage, even if there is a burst of outside disturbance noise.

Outer shield 112 is grounded at (156) by being connected to the frame ground (FG) point of the chassis of the prober by a cable 134.

First inner shield 128 is connected to a force terminal (F) 155 by a cable 138 via an impedance device (Z) 130, and to another force terminal of a ground unit (GDU) 152 by a cable 166. Here, impedance device (Z) 130 can be an inductor, a resistor, or the both of an inductor and a resister. When it is an inductor, it can be brought to high impedance at the AC component without have any effects on the DC component. In this case, an inductance element wherein the material through which the current will flow is coiled around a toroidal core is preferred, and it is preferred that a relatively thick wiring material be used so that the DC properties or performances are not compromised. When a resistor is used, it is preferred that it be of low resistance. Although there will be some loss of the DC component in this case, however, a specific impedance can be applied to the AC component regardless of frequency. Moreover, it is preferred that impedance device (Z) 130 be disposed as close as possible to first inner shield 128, for instance, in the space inside support base 132.

The first inner shield is connected to a sense terminal (S) 151 by a cable 139, and to the sense terminal of ground unit 152 by a cable 164. This Kelvin connection is preferably designed to have a sufficiently wide bandwidth in order to absorb the noise between ground unit 152 and first inner shield 128. The ground unit is not necessarily designed to have high performance in comparison with the A COM terminal of measuring unit 148, but it is preferred that it is capable of supplying relatively clean DC voltage.

Cables 136, 138, and 139 are preferably coaxial cables, and the outer conductor of any of these cables is preferably connected to the frame ground (FG) point of the chassis of the prober for shielding the inner conductors.

On the other hand, the A COM terminal of measuring unit 148 is connected to second inner shield 114 by a cable 162 via a terminal 170 disposed at probe card 118, further via a jumper wire 172, or a wiring pattern (not illustrated) on the surface of the probe card, and further via an electrical connection means 116, such as a screw or a cable.

Even if, for instance, noise is applied to the chassis of the prober and the potential of outer shield 112 fluctuates, first inner shield 128 is connected from the outside via impedance device 130; therefore, there is rarely any fluctuation of potential. There is virtually no potential difference between the first inner shield and the second inner shield; consequently, inflow and outflow of noise current are virtually inhibited and have little effect, even if there is a floating capacitor between the two inner shields. As a result, the potential of the chuck can be protected from the effects of noise. Thus, electrical testing of device under test 122 can be performed at high speed and with good accuracy.

It should be noted that the above-mentioned description used a Kelvin connection for connection of ground unit 152 and inner shield 128. However, depending on the extent of the noise, the test can be performed without a Kelvin connection by removing cable 139 and joining force cable 166 and the sense cable from ground unit 152 with force terminal 155.

A prober 210 for testing display panels and a testing apparatus 200 thereof will be described as another preferred embodiment of the present invention using FIG. 2. The same reference numbers are used for the parts in FIG. 2 that are the same as in FIG. 1 and a description thereof is therefore omitted.

Figure 2:
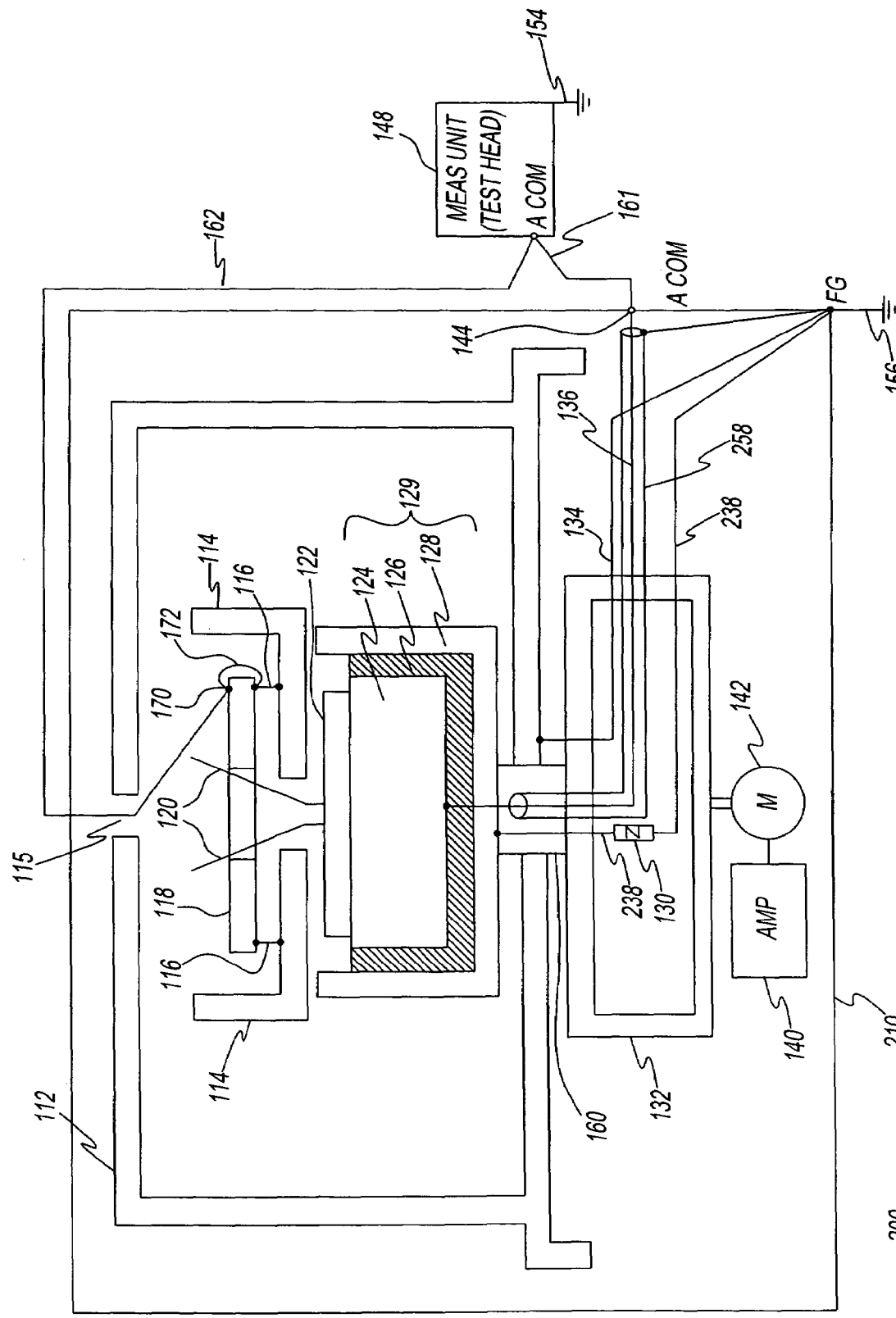
FIG. 2 is a schematic drawing showing the structure of the testing apparatus that is another preferred embodiment of the present invention.

FIG. 2 differs from FIG. 1 in that first inner shield 128 is connected to the frame ground of the prober chassis by a cable 238 via impedance device 130, and cable 238 is a single-wire cable. As a result, a prober and a testing apparatus that protect the chuck potential from the effects of noise can be provided at a low cost without requiring a ground unit, depending on the extent or degree of the noise of the prober chassis.

The above-mentioned is given as a description of the present invention. The testing of display panels of the present invention is not only testing of almost completed display panels after the light-emitting material or liquid crystal material has been made, but also testing of uncompleted display panels when the matrix circuit is formed but before the light-emitting material or liquid crystal material has been made. Moreover, the shape and parameters of the fine parts of the above-mentioned embodiments of the present invention were given for description; the present invention is in not limited to these embodiments and various modifications and revisions can be made by combining known technologies with the present invention. For instance, the sides of the first shield extend projecting from the top surface of the chuck, but the walls can be a variety of shapes. For instance, they do not necessarily extend straight up; the ends may curve toward the inside.

As described above, by means of the prober for display panels and testing apparatus thereof of the present invention, the chuck stage is kept at high impedance in terms of AC signals and an electrostatic shield is effectively implemented; therefore, the chuck potential is effectively protected from the effects of noise, so that high-speed, high-accuracy testing by electrical measurement is thereby possible.

What is claimed is:

1. A prober for testing display panels comprising
a chuck,
a support base that supports said chuck,
a first inner shield that shields said chuck, and
an outer shield that encloses said chuck and said first inner shield,
wherein said outer shield is connected to a chassis, said chuck is connected to a first connector by a first cable, and said first inner shield is connected to a second connector by a second cable with an impedance device in between.

2. The prober according to claim 1, wherein said first or second cable is a coaxial cable which comprises an outer conductor, wherein said outer conductor is connected to said chassis.

3. The prober according to claim 1, further comprising a third connector connected to the place where the second cable is connected to the first inner shield by a third cable.

4. The prober according to claim 3, wherein any of said first through third cables is a coaxial cable and said outer conductors of each said first through third cables are connected to said chassis.

5. The prober according to claim 1, wherein said impedance device includes an inductor.

6. The prober according to claim 1, wherein said impedance device includes an inductor that uses a toroidal core.

7. The prober according to claim 1, wherein said impedance device includes a resistor.

8. The prober according to claim 1, wherein said impedance device is disposed near the first inner shield.

9. The prober according to claim 8, wherein said impedance device is inside said support base.

10. The prober according to claim 1, which comprises a second inner shield that shields the top of said chuck inside said outer shield, and
said first inner shield shields the bottom and sides of said chuck.

11. The prober according to claim 10, wherein said second inner shield is in the shape of a ring.

12. The prober according to claim 10, where said second inner shield has an L-shaped cross section.

13. The prober according to claim 10, wherein said second inner shield comprises a connector for connection with a specific signal line of a probe card housed over the top of this second inner shield.

14. The prober according to claim 1, where in said outer shield has an opening in the top part.

15. The prober according to claim 14, wherein said outer shield encloses the entire region of movement of said chuck.

16. The probe according to claim 1, wherein said first inner shield covers the bottom and the sides of said chuck, with the covering of the sides extending by projecting above the top surface of the chuck.

17. A prober for testing display panels comprising
a chuck,
a support base that supports said chuck,
a first inner shield that shields said chuck, and
an outer shield that encloses said chuck and said first inner shield,
wherein said outer shield is connected to a chassis, said chuck is connected to a first connector by a first cable, and said first inner shield is connected to the chassis by a second cable with an impedance device in between.

18. The prober according to claim 17, wherein said first cable is a coaxial cable comprising an outer conductor which is connected to said chassis.

19. An apparatus for testing display panels, comprising:
a prober for testing display panels which comprises: a chuck, a support base that supports said chuck, a first inner shield that shields said chuck, and an outer shield that encloses said chuck and said first inner shield, wherein said outer shield is connected to a chassis, said chuck is connected to a first connector by a first cable, and said first inner shield is connected to a second connector by a second cable with an impedance device in between;
a first voltage source that supplies a first predetermined voltage to said first connector, and
a second voltage source that supplies a second predetermined voltage to said
second connector.

20. An apparatus for testing display panels, comprising:
a prober for testing display panels which comprises: a chuck, a support base that supports said chuck, a first inner shield that shields said chuck, and an outer shield that encloses said chuck and said first inner shield, wherein said outer shield is connected to a chassis, said chuck is connected to a first connector by a first cable, and said first inner shield is connected to the chassis by a second cable with an impedance device in between; and
a first voltage source that supplies a first predetermined voltage to said first connector.

21. An apparatus for testing display panels, comprising:
a prober for testing display panels which comprises: a chuck, a support base that supports said chuck, a first inner shield that shields said chuck, and an outer shield that encloses said chuck and said first inner shield, wherein said outer shield is connected to a chassis, said chuck is connected to a first connector by a first cable, said first inner shield is connected to a second connector by a second cable with an impedance device in between, and a third connector connected to the place where the second cable is connected to the first inner shield by a third cable;

a first voltage source that supplies a first predetermined voltage to said first connector; and a second voltage source connected to the second and third connectors that supplies a second predetermined voltage.

22. The apparatus according to claim 21, further comprising a fourth cable that supplies said first predetermined voltage that is supplied to said first connector from said first voltage source to said second inner shield via said probe card.

* * * * *